United States Patent [19]

Coleman

[11] 3,818,451

[45] June 18, 1974

[54] LIGHT-EMITTING AND LIGHT-RECEIVING LOGIC ARRAY

[75] Inventor: Michael G. Coleman, Tempe, Ariz.

[73] Assignee: Motorola Inc., Franklin Park, Ill.

[22] Filed: Mar. 15, 1972

[21] Appl. No.: 234,798

[52] U.S. Cl. ....... 340/166 EL, 250/220 M, 307/311

[51] Int. Cl. .... G02f 1/00, H01j 31/50, H03k 19/14

[58] Field of Search .... 340/166 EL, 173 LS, 324 R; 307/311, 312; 178/5.4 R, 5.4 EL; 250/220 M

[56] References Cited

UNITED STATES PATENTS

| | | | |
|---|---|---|---|
| 3,479,517 | 11/1969 | Bray et al. | 250/220 M |
| 3,511,925 | 5/1970 | Lee et al. | 178/5.4 EL |
| 3,524,986 | 8/1970 | Harnden, Jr. | 307/311 X |
| 3,525,024 | 8/1970 | Kawaji | 307/312 X |
| 3,577,018 | 5/1971 | Wada | 307/312 X |
| 3,696,389 | 10/1972 | Fenner | 340/324 R |
| 3,697,762 | 10/1972 | Kurtz | 307/311 X |

*Primary Examiner*—Donald J. Yusko
*Attorney, Agent, or Firm*—Vincent J. Rauner; Harry M. Weiss

[57] ABSTRACT

A logic array having a plurality of light emitters, each emitter producing light of one of a plurality of wavelengths in response to an input electronic signal. The light emitted, of one of a plurality of wavelengths, is detected by at least one of a plurality of light receivers, responsive to the one wavelength. The output of each of the light receivers can be combined to produce an output electronic signal when predetermined ones of the light receivers respond to the emitted light.

12 Claims, 5 Drawing Figures

LIGHT-EMITTING AND LIGHT-RECEIVING LOGIC ARRAY

BACKGROUND OF THE INVENTION

Extremely high speed is required for the transmission and handling of data in the form of electronic signals. The ever-expanding need for faster and faster transmission and handling of such data has required a great deal of effort to overcome attendant technical problems. A logic array utilizing light transmission and handling of data instead of conductors over which electronic signals are transmitted is very useful in, for example, digital computers.

Solid state components are used in today's digital computers and the solid state components are more commonly of the integrated circuit type than of the discrete circuit type. Combinations of discrete and integrated circuits are used, such combinations being known as hybrid integrated circuits. In any case, the components are usually grouped together in modules. These modules take the form of printed circuit boards to which are attached the integrated circuits, the hybrid integrated circuits or the discrete components. The printed circuit board provides for interconnection within the circuits attached to it and other connections must be made from one module to another. The extremely high operational frequencies have caused problems with radiation, noise and grounding. Computer designers have used twisted pairs, coaxial cable and other forms of shielding, including metal shielding, in an attempt to reduce the side effects of the extreme speed. Strategic placement of the logic array disclosed herein can provide superior noise and radiation isolation in a digital computer. Of course, the logic array described herein is not limited to application in a digital computer, but has utility in many electronic devices.

BRIEF SUMMARY OF THE INVENTION

The logic array is comprised of a plurality of light emitting devices such as light-emitting diodes (LED), and light receiving devices such as semiconductor photo diodes (detector) or photo transistors. The input to each of the LEDs can be selectively activated by an electronic signal which may be the output of a logic circuit. The LEDs, which are well known, each produce a light having a wavelength which is one of a number of selected wavelengths. The detectors, which are well known, are selected to respond to light of only one of the wavelengths emitted. For example, three LEDs may be used, each formed of a different material so that the wavelength of the light emitted by each of them is separate and distinct from the other two. Three detectors could be used, each responding only to one of the emitted wavelengths. The outputs of the detectors can then be combined to form desired logic configurations. Still another configuration could include a detector that could be activated by more than one wavelength, by itself providing an "OR" circuit. Obviously, there is no limitation on the combinations available. For example, two of the LEDs could be selected to emit light of the same wavelength with one or more of the detectors responsive to that wavelength. A pair of LEDs and a pair of detectors could be used and will be explained in detail below.

Photo diodes and photo transistors are well suited to detect coherent light as emitted by laser. The wavelength of light emitted by a laser is dependant upon the material that is lased. Therefore, a laser may be substitited for an LED with appropriate changes for the light input excitation required.

A primary object of this invention is to perform logic functions utilizing the several wavelengths of light and at the same time to provide electrical isolation between input signals and output signals.

An object of this invention is to receive electrical signals, transmit them in the form of light of preselected wavelengths, and to change the light into electrical signals.

These and other objects will be made clear in the detailed description that follows.

DETAILED DESCRIPTION

Figure 1:
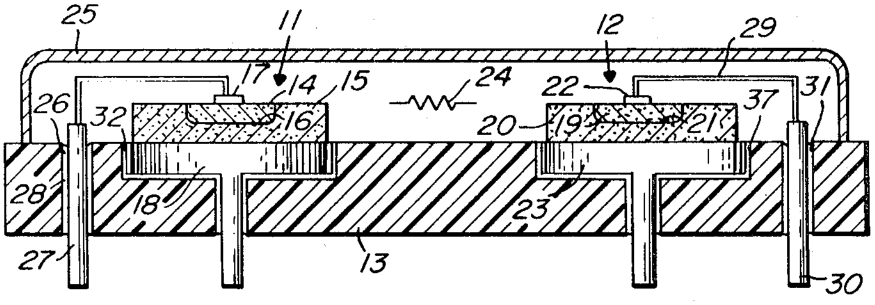
FIG. 1 is a cross-section of a hybrid integrated circuit showing one LED and one detector.

Referring first to FIG. 1, a semiconductor hybrid integrated circuit device is shown. It includes an LED 11 and a detector 12 mounted on a planar surface of a common header 13 but electrically isolated by insulators 32 and 37 from the header 13 and from each other, while being light coupled. The LED 11 comprises a P-conductivity region 14 and an N-conductivity region 15 defining a light emitting PN junction 16 extending to the surface. Suitable electric contacts 17 and 18 respectively contact the P- and N-conductivity regions to excite the LED to emit light. Input signals may be applied to terminal 27 which is insulated from the header 13 by insulator 28, through conductor 26 to contact 17.

The detector 12 comprises a P-conductivity region 19 and an N-conductivity region 20 defining a photo sensitive PN junction 21 therebetween, extending to the surface of the header 13. Suitable electrical contacts 22 and 23 respectively, contact the P-conductivity region 19 and the N-conductivity region 20 for connecting a detected signal to an external circuit or to another detector (not shown) also integral with the semiconductor integrated circuit device. Contact 22 is connected to conductor 29 which in turn is connected to terminal 30. Terminal 30 is isolated from header 13 by insulator 31.

Figure 2:
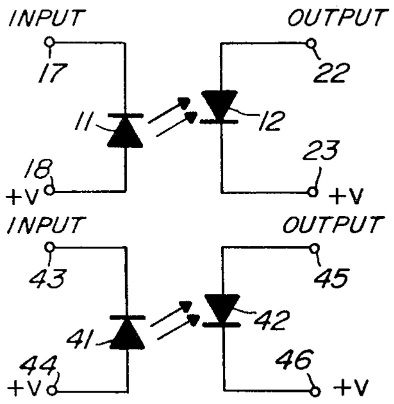
FIG. 2 is a schematic diagram of a pair of LEDs and a pair of detectors.

To enhance transmission of the light from the LED 11 to the detector 12, a suitable transparent insulating material 24 such as glass, covered with a layer of reflective material 25 is provided. Thus an electrical signal coupled to the LED 11 will transmit light to the detector 12 which may be logically combined with detector 42 (FIG. 2). This mode of light transmission has an advantage in that the portion of the circuit from which the signal is to be transmitted is completely electrically decopuled from that portion of the circuit which will receive the signal, thereby eliminating voltage transients and/or noise from the output circuit.

FIG. 2 illustrates LED 11 forward-biased at terminal 18 and connected to input terminal 17. Detector 12, responsive to the light emitted by LED 11 and not responsive to light emitted by LED 41 is shown reverse-biased at terminal 23. If the PN junction of the detector 12 is forward-biased, the net increase in current will be relatively insignificant. However, if the junction of detector 12 is reverse-biased as shown, the change in current will be quite appreciable. In the preferred embodiment, LED 11 is comprised of gallium arsenide and detector 12 is comprised of silicon. Thus the wavelength of light emitted from LED 11 is approximately 9,000 angstroms.

LED 41 emits light upon excitation by an input at terminal 43. Detector 42, reverse-biased, responds to the light emitted by LED 41. In the preferred embodiment, LED 41 is comprised of gallium indium arsenide and detector 42 is comprised of germanium.

The germanium is responsive to a wavelength of approximately 15,000 angstroms emitted by LED 41. To insure that detector 42 does not respond to light emitted from LED 11, an optical filter (not shown) may be placed above detector 42. Optic filters capable of filtering wavelengths of 9,000 angstroms are well known.

Figure 3:
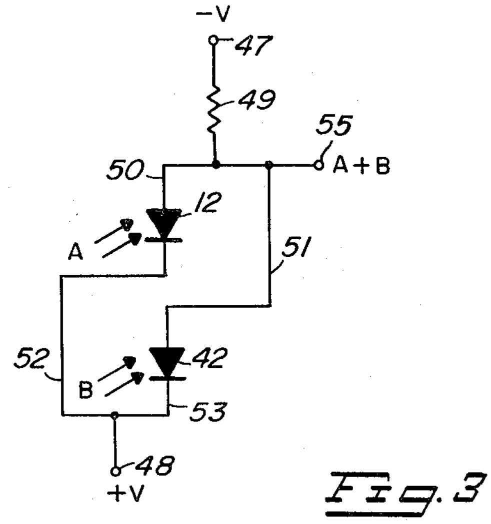
FIG. 3 is a schematic diagram of two detectors connected in an "OR" configuration.

FIG. 3 shown detectors 12 and 42 connected by conductors 50 and 51 respectively to resistor 49 to a source of negative potential at terminal 47. Reverse bias is completed through conductors 52 and 53 respectively, to a source of positive potential at terminal 48. The output is taken at terminal 55. The detectors 12 and 42 interconnected as shown form a logical "OR" circuit.

Figure 4:
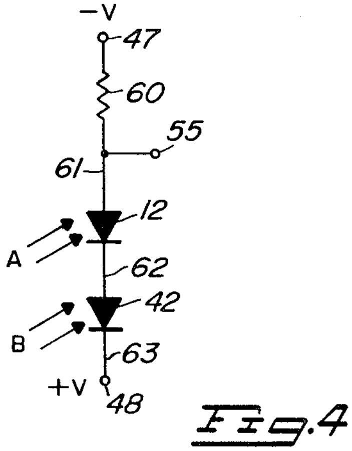
FIG. 4 is a pair of detectors connected together in an "AND" configuration.

FIG. 4 shows detectors 12 and 42 interconnected to form a logic "AND" circuit. Detector 42 is connected through conductor 63 to a source of positive potential at terminal 48 and is connected in series through conductor 62 with detector 12 which is connected through conductor 61 and resistor 60 to a source of negative potential at terminal 47. The output is taken at terminal 55.

Figure 5:
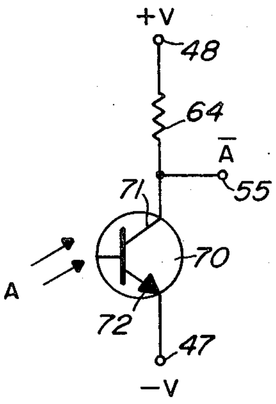
FIG. 5 is a schematic diagram of a photo transistor connected as an inverter.

FIG. 5 illustrates a photo transistor 70 whose emitter 71 is connected through resistor 64 to a source of positive potential at terminal 48. Emitter 72 is connected to a source of negative potential at terminal 47 and the output is taken at terminal 55. This forms a simple inverter circuit. A photo detector, operating as a shunt across a transistor, could also be used as an inverter circuit.

MODE OF OPERATION

Refer first to FIG. 2 where LEDs 11 and 41 are shown. An input electronic signal may be impressed on terminal 17 from an electronic logic source within the integrated circuit or from outside the integrated circuit. An electronic signal may also be introduced at terminal 43. In the presence of an electronic signal at terminal 17, LED 11 emits light at a wavelength of approximately 9,000 angstroms. In the presence of a signal at input terminal 43, LED 41 emits light at a wavelength of approximately 15,000 angstroms. A detailed description of the operation and theory of LEDs and detectors is contained in copending application, Ser. No. 186,883 assigned to Motorola, Inc., the assignee of this application.

Referring now to FIG. 3, the LEDs are not shown but the wavelengths from them are indicated as "A" and "B." If wavelength "A" causes detector 12 to respond, current will flow through resistor 49 making the potential at point 55 more positive. If detector 42 responds to wavelength "B," current will flow through resistor 49, causing the potential at terminal 55 to become more positive. If both detector 12 and detector 42 respond, the result is the same — that is to say, the potential at terminal 55 becomes more positive. An arbitrary assignment of a value of binary "one" to a positive voltage and an arbitrary assignment of a binary "zero" to a less positive voltage enables the circuit of FIG. 3 to operate as an "OR" circuit. If detector responds to wavelength "A" or if detector 42 responds to wavelength "B," or if both respond at the same time, the result is the same. The output at terminal 55 may be expressin in boolean form A + B.

Referring to FIG. 4, assume that a positive potential represents "one" and a less positive potential represents "zero." If detector 12 responds to wavelength "A," there will be no increase in current flow through resistor 60 unless detector 42 is concurrently responding to wavelength "B." Detector 42 and detector 12 must respond at the same time in order for terminal 55 to go more positive in potential. The output then at terminal 55 may be expressed in boolean form: $A \cdot B$.

FIG. 5 illustrates a simple inverter circuit using a photo transistor. When photo transistor 70 responds to wavelength "A," current flows through resistor 64 causing terminal 55 to become more negative. The output then at terminal 55 may be expressed as: $\overline{A}$.

A "NOR" circuit is formed simply by taking the output of the circuit shown in FIG. 3 at terminal 55 to an inverter, such as a transistor. The "NOR" circuit is simply an inversion of the "OR" circuit shown in FIG. 3.

A "NAND" circuit may be formed by inverting the output of FIG. 4 at terminal 55. The "NAND" circuit is simply the inversion of the "AND" circuit.

Thus a logic array is provided for transmission of information in the form of light within an integrated circuit or from one remote point to another. In either case, superior isolation is provided. Of course, those skilled in the art are fully capable of interconnecting these components to achieve any desired logic configuration, all within the spirit of this invention.

I claim:

1. A light-emitting and light-receiving hybrid integrated monolithic logic array having input means for receiving digital data in the form of electronic signals and output means for transmitting output digital data in the form of electronic signals comprising:

a. a plurality of light-emitting means for producing a plurality of prescribed wavelengths, each one of the light-emitting means producing light of one wavelength out of a plurality of prescribed wavelengths produced by the plurality of light-emitting means when an input electronic signal is received;

b. a plurality of light-receiving means, each one of the light-receiving means responsive to light of one of the wavelengths emitted by the plurality of light-emitting means and producing an electronic signal when light of the one wavelength is received and;

c. combining means, having input means for receiving the electronic signals from the light-receiving means, for combining the electronic signals to produce an output electronic signal when the light-receiving means respond to the light-emitted in a prescribed manner, said hybrid integrated monolithic logic array being located in a reflective housing having a transparent insulator located between said lightemitting means and said light-receiving means.

2. The logic array of claim 1 wherein the plurality of light-emitting means comprise light-emitting diodes and the plurality of light-receiving means comprise semiconductor photo diodes.

3. The logic array of claim 1 wherein the plurality of light-emitting means comprise light-emitting diodes and the plurality of light-receiving means comprise photo transistors.

4. A light-emitting and light-receiving hybrid integrated monolithic logic array having input means for receiving digital data in the form of electronic signals and output means for transmitting output digital data in the form of electronic signals, comprising:

a. at least one light-emitting means for emitting light of a first wavelength in response to one of the input electronic signals;

b. at least one light-emitting means for emitting light of a second wavelength in response to one of the input electronic signals the first and second light emitting means operating simultaneously when the input electronic signals are simultaneous;

c. at least one light-receiving means for producing an electronic signal upon receiving light of the first wavelength;

d. at least one light-receiving means for producing an electronic signal upon receiving light of the second wavelength and;

e. combining means having input means for receiving electronic signals from the light-receiving means, for combining the electronic signals in a desired Boolean relationship to produce an output electronic signal when the light-receiving means respond to the light emitted in a prescribed manner, said hybrid integrated monolithic logic array being located in a reflective housing having a transparent insulator located between said light-emitting means and said light-receiving means.

5. The logic array of claim 4 wherein the plurality of light-emitting means comprise light-emitting diodes and the plurality of light-receiving means comprise semiconductor photo diodes.

6. The logic array of claim 4 wherein the plurality of light-emitting means comprise light-emitting diodes and the plurality light-receiving means comprise photo transistors.

7. The logic array of claim 5 wherein the combining means comprise an AND circuit.

8. The logic array of claim 5 wherein the combining means comprise an OR circuit.

9. The logic array of claim 6 wherein the combining means comprise an AND circuit.

10. The logic array of claim 6 wherein the combining means comprise an OR circuit.

11. The logic array of claim 5 wherein the light-emitting diode for emitting light of a first wavelength is comprised of Gallium Arsenide and the wavelength produced is approximately 9,000 Angstroms, and the light-receiving semiconductor photo detector for receiving the first wavelength is comprised of silicon.

12. The logic array of claim 11 wherein the light-emitting diode for emitting light of the second wavelength is comprised of Gallium Indium Arsenide and the wavelength produced is approximately 15,000 Angstroms and the semiconductor photo detector for receiving the second wavelength is Germanium.

* * * * *